US011290107B2

(12) United States Patent
Leonardo et al.

(10) Patent No.: US 11,290,107 B2
(45) Date of Patent: Mar. 29, 2022

(54) HIGH-VOLTAGE OUTPUT DRIVER FOR A SENSOR DEVICE WITH REVERSE CURRENT BLOCKING

(71) Applicant: ams AG, Premstaetten (AT)

(72) Inventors: Vincenzo Leonardo, Premstaetten (AT); Camillo Stefanucci, Premstaetten (AT)

(73) Assignee: AMS AG, Premstaetten (AT)

( * ) Notice: Subject to any disclaimer, the term of this patent is extended or adjusted under 35 U.S.C. 154(b) by 142 days.

(21) Appl. No.: 16/642,265

(22) PCT Filed: Jul. 12, 2018

(86) PCT No.: PCT/EP2018/068946
§ 371 (c)(1),
(2) Date: Feb. 26, 2020

(87) PCT Pub. No.: WO2019/042643
PCT Pub. Date: Mar. 7, 2019

(65) Prior Publication Data
US 2021/0075421 A1 Mar. 11, 2021

(30) Foreign Application Priority Data
Aug. 29, 2017 (EP) .................................... 17188317

(51) Int. Cl.
*H03K 19/003* (2006.01)
*H02H 3/18* (2006.01)
(Continued)

(52) U.S. Cl.
CPC ......... *H03K 19/00315* (2013.01); *H02H 3/18* (2013.01); *H03K 17/6877* (2013.01); *H03K 19/0027* (2013.01); *H03K 19/018507* (2013.01)

(58) Field of Classification Search
CPC ......... H03K 19/00315; H03K 17/6877; H03K 19/0027; H03K 19/018507; H02H 3/18
See application file for complete search history.

(56) References Cited

U.S. PATENT DOCUMENTS 5,160,855 A 11/1992 Dobberpuhl
5,933,027 A 8/1999 Morris
(Continued)

FOREIGN PATENT DOCUMENTS

EP 0874462 10/1998
EP 1246362 10/2002

OTHER PUBLICATIONS

Hao-Ping Hong et al.: "A Reverse-Voltage Protection Circuit for MOSFET Power Switches" IEEE Journal of Solid-State Circuits, vol. 36, No. 1, Jan. 2001.
(Continued)

*Primary Examiner* — Jung Kim
(74) *Attorney, Agent, or Firm* — MH2 Technology Law Group LLP

(57) ABSTRACT

A high-voltage output driver (1) for a sensor device (100) with reverse current blocking comprises a supply node (SN) to apply a supply voltage (VHV) and an output node (OP) to provide an output signal (OS) of the high-voltage output driver (1). The high-voltage output driver (1) comprises a driver transistor (MP0) being disposed between the supply node (SN) and the output node (OP). The high-voltage output driver (1) further comprises a bulk control circuit (20) to apply a bulk control voltage (Vwell) to a bulk node (BMP0) of the driver transistor (MP0), and a gate control circuit (30) to apply a gate control voltage (GCV) to the gate node (GMP0) of the driver transistor (MP0).

15 Claims, 7 Drawing Sheets

(51) Int. Cl.
*H03K 17/687* (2006.01)
*H03K 19/00* (2006.01)
*H03K 19/0185* (2006.01)

(56) References Cited

U.S. PATENT DOCUMENTS

| | | |
|---|---|---|
| 5,963,055 A | 10/1999 | Tanaka et al. |
| 6,320,415 B1 | 11/2001 | Lee |
| 6,628,489 B1 | 9/2003 | Pardoen et al. |
| 8,669,805 B2 | 3/2014 | Serventi et al. |
| 2014/0160600 A1 | 6/2014 | Maggio et al. |

OTHER PUBLICATIONS

European Patent Office, International Search Report for PCT/EP2018/068946 dated Oct. 9, 2018.

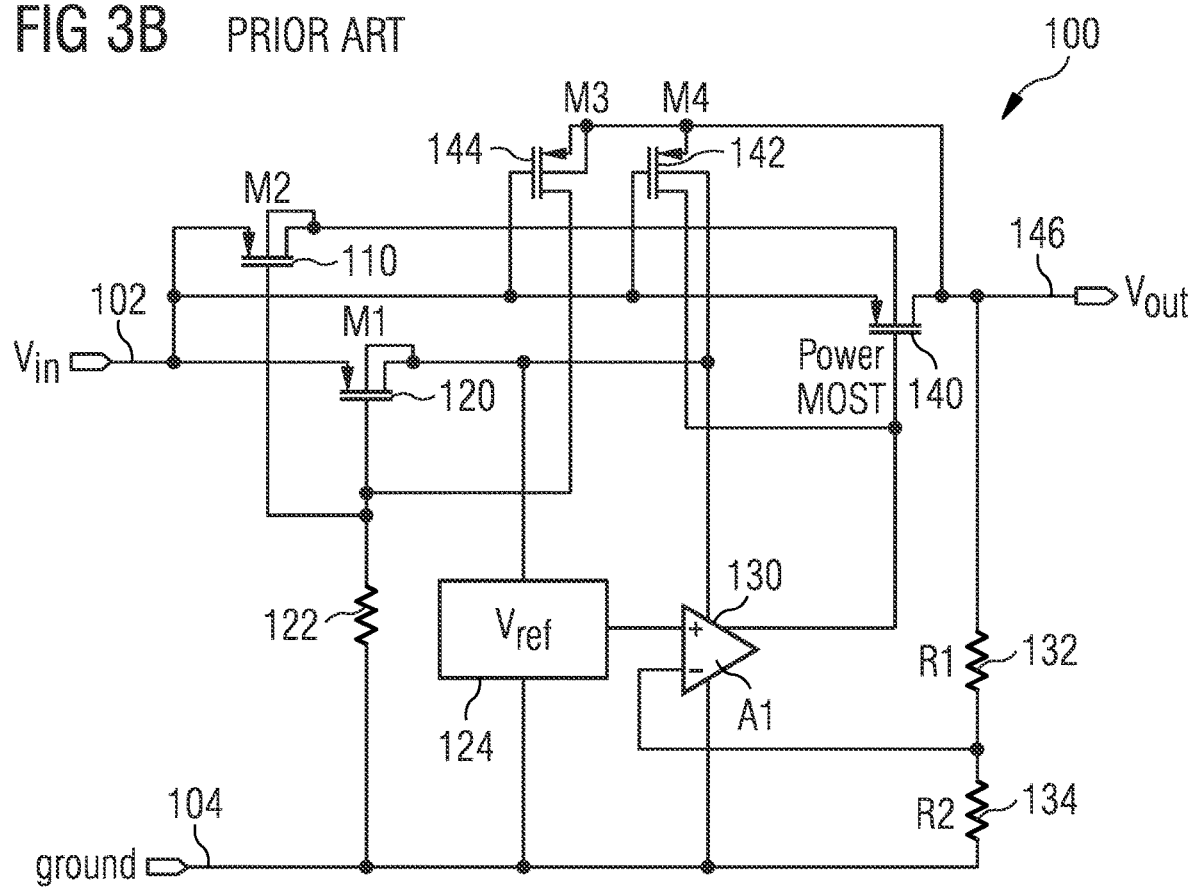

HIGH-VOLTAGE OUTPUT DRIVER FOR A SENSOR DEVICE WITH REVERSE CURRENT BLOCKING

TECHNICAL FIELD

The disclosure relates to a high-voltage output driver for a sensor device with reverse current blocking capabilities.

BACKGROUND

A sensor device comprises an output driver to generate an output signal of the sensor. In particular, an industrial sensor may comprise a 3-wire push-pull high-voltage output driver.

An embodiment of a sensor device 100 comprising an output driver 1 is shown in FIG. 1. Some standards for industrial sensors does not allow currents above ILoff=0.5 mA to flow through a load resistance Rload into the sensor's signal wire through the output terminal Q of the sensor and into the output driver 1 via the output node QP of the output driver, when the driver is off.

In presence of a reverse polarity protection diode D2 in the supply path, the output terminal Q of the sensor/the output node QP of the output driver 1 is pulled up above the high-voltage supply VHV seen by the output driver at a supply node SN if the signal is pulled up by e.g. the load resistance Rload to a potential L+. In the example shown in FIG. 1, the output terminal Q of the sensor 1/the output node QP of the output driver 1 is pulled up to 24 V, i.e. above the high-voltage supply of 23.4 V seen by the output driver 1 at the supply node SN. Under this condition, the driver transistor MP conducts in reverse leading to a current flowing into the output terminal Q of the sensor device 1/the output node QP of the output driver.

There is a need to provide a high-voltage output driver for a sensor device that prevents any current flowing into the output terminal of the sensor device/the output node of the output driver of the sensor device in a reverse polarity condition.

SUMMARY

A high-voltage output driver for a sensor device that prevents any current flow into the sensor's signal wire is specified in claim 1.

According to the embodiment of the high-voltage output driver defined in claim 1, the high-voltage output driver comprises a supply terminal to apply a supply voltage, an output terminal to provide an output signal of the high-voltage output driver and a reference terminal to apply a reference voltage. The high-voltage output driver comprises a high-side driver transistor being disposed between the supply terminal and the output terminal. The high-voltage output driver further comprises a bulk control circuit to apply a bulk control voltage to the bulk node of the high-side driver transistor, and a gate control circuit to apply a gate control voltage to the gate node of the high-side driver transistor.

The proposed embodiment of the high-voltage output driver solves the mentioned problem on IC level by shifting up the reverse voltage at which the driver transistor of the output driver starts conducting in reverse. The bulk control circuit of the proposed circuit configuration is configured as an independent well/bulk switch, and the gate control circuit provides a smart gate control for the isolation and control of the control/gate node of the high-side driver transistor.

The accompanying drawings are included to provide a further understanding and are incorporated in and constitute a part of this specification. The drawings illustrate several embodiments of high-voltage output drivers for a sensor device, and together with the description serve to explain principles and the operation of the various embodiments.

BRIEF DESCRIPTION OF THE DRAWINGS

FIG. 3B shows a possible implementation of an output driver for a sensor device having reverse current protection with a smart gate control of a driver transistor according to a prior art solution;

DETAILED DESCRIPTION

Figure 1:
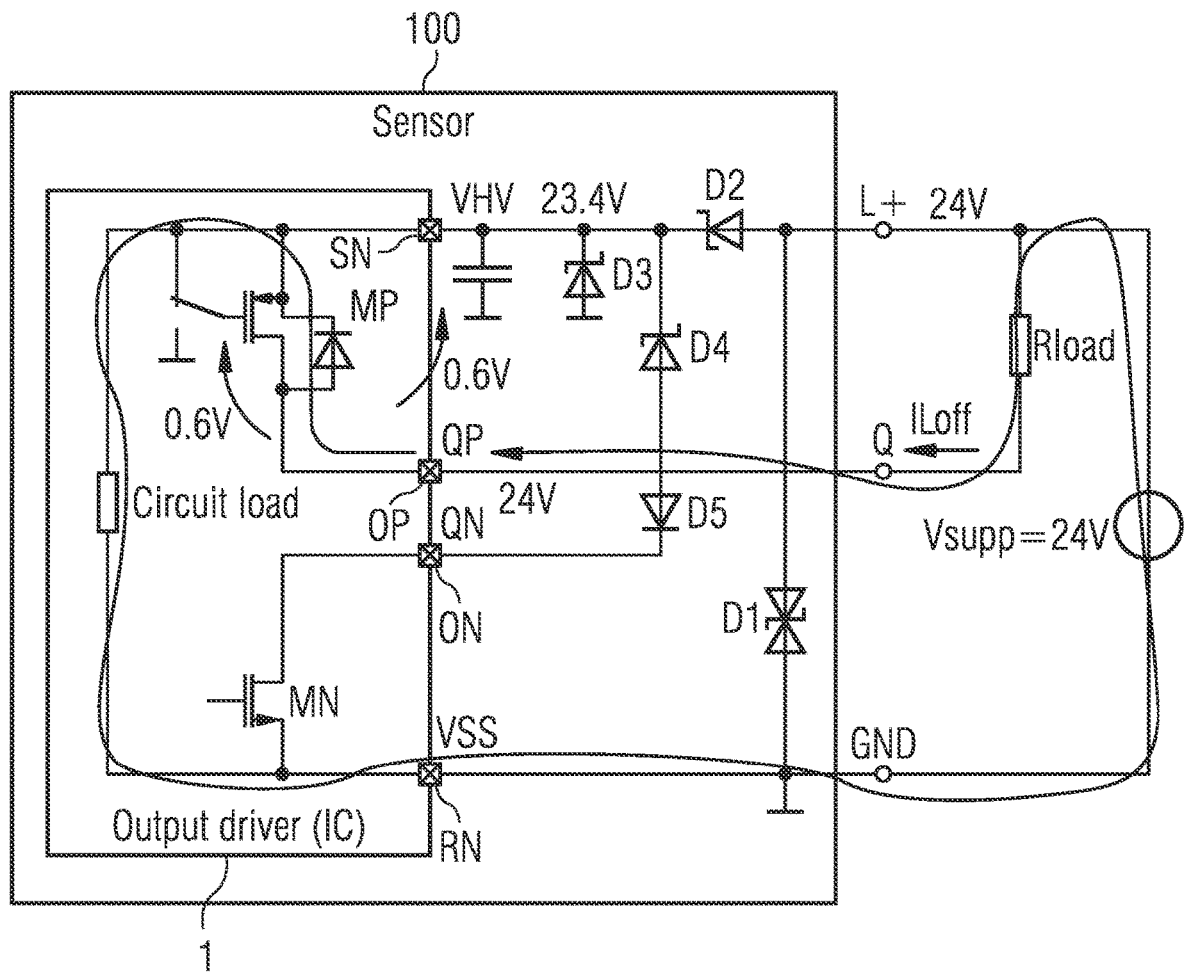
FIG. 1 shows an embodiment of a sensor device comprising a high-voltage output driver having a driver transistor that starts conducting in reverse in a reverse polarity condition.
Figure 2:
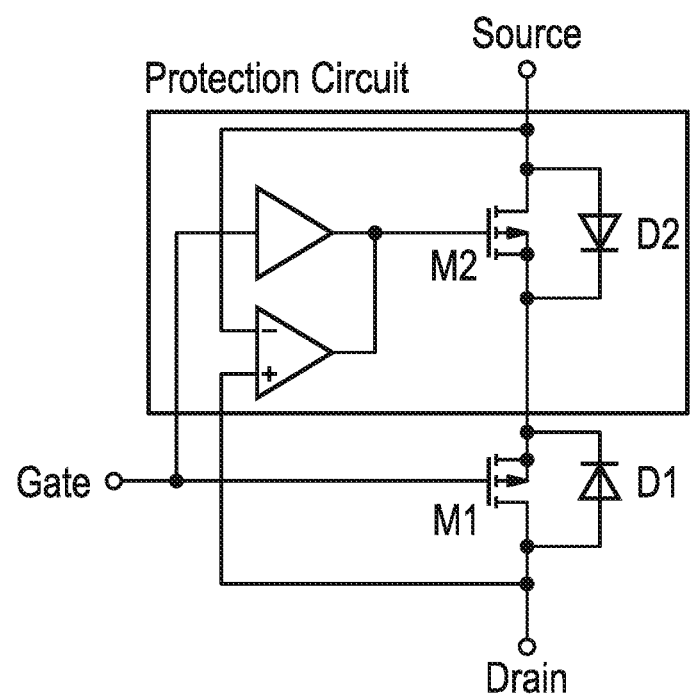
FIG. 2 shows a possible implementation of an output driver for a sensor device having reverse current protection according to a prior art solution.

FIG. 2 illustrates a circuit configuration of a known solution of an output driver for a sensor device having reverse current protection with back-to-back connected PMOS transistors to isolate the parasitic diodes in either way as described by Hao-Ping Hong and Jiin-Chuan Wu, Member IEEE, in IEEE JOURNAL OF SOLID-STATE CIRCUITS, VOL. 36, NO. 1, January 2001: A Reverse-Voltage Protection Circuit for MOSFET Power Switches. The reference signs in FIG. 2 correspond to the reference signs in FIG. 1(a) of the original document of Hao-Ping Hong and Jiin-Chuan Wu.

Two transistors are connected in series with their sources connected together (back-to-back). The additional series transistor increases the area significantly if the driver strength has to remain the same. This solution is not area efficient, as the required area for a driver becomes bigger due to the series connection of two transistors (4x area). In order to control the bulk and the gate potential additional circuitry like comparators or latches are needed.

This solution allows supporting reverse voltages up to the voltage level of the normal operation, e.g. 24V, which is not necessarily needed to solve the current problem. This solution also allows the supply voltage to go below the substrate by keeping the reverse current blocked. This feature is also not needed for the current problem.

Figure 3A:
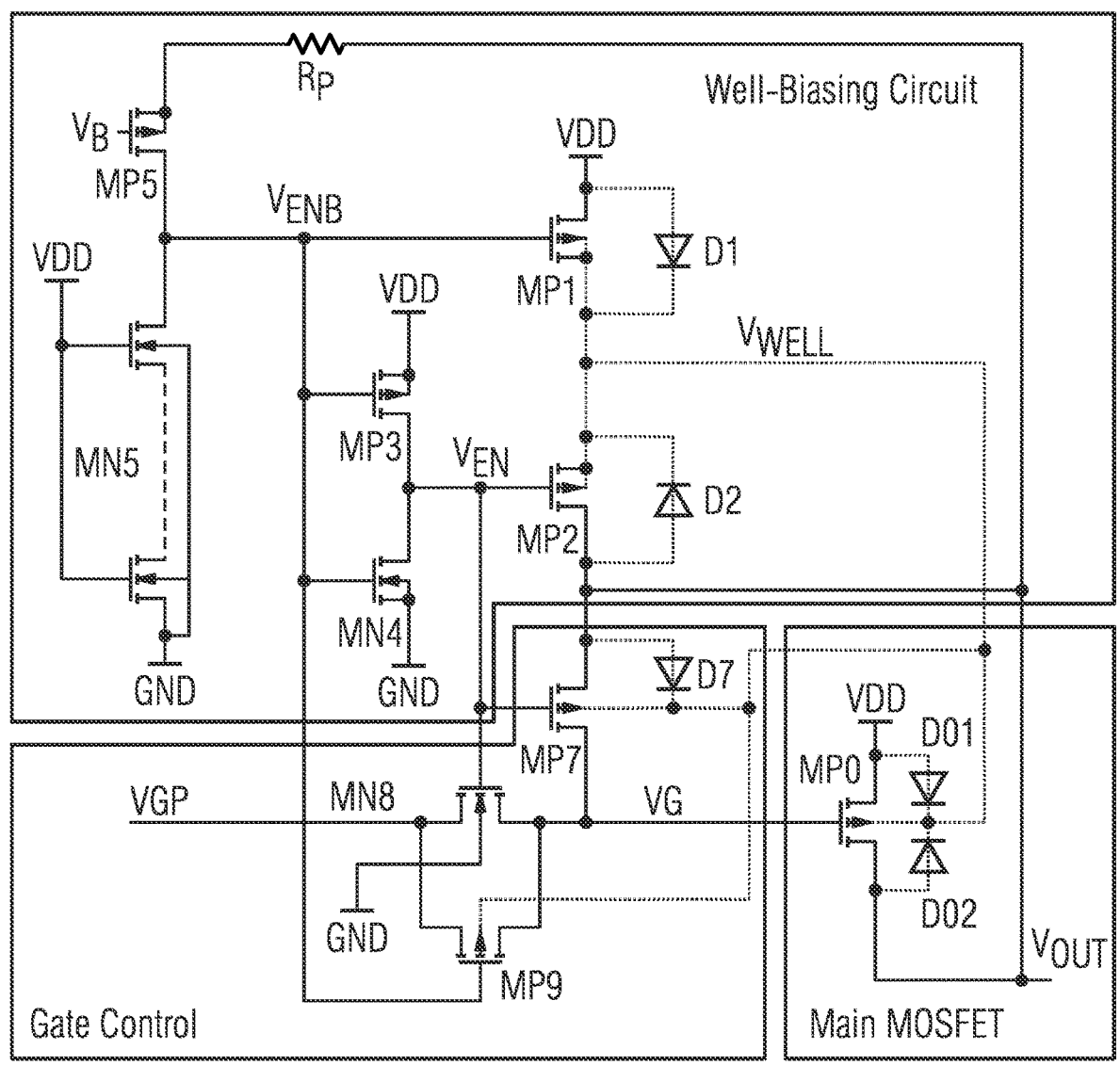
FIG. 3A shows a possible implementation of an output driver for a sensor device having reverse current protection with a smart gate control of a driver transistor according to a prior art solution.

The only cost efficient way to provide a solution for the above-discussed problem is a well-switching of the PMOS transistor in addition to a smart gate control to switch off the driver transistor properly in a reverse condition. Such a solution is explained by Hao-Ping Hong and Jiin-Chuan Wu in "A Reverse-Voltage Protection Circuit for MOSFET Power Switches". FIG. 3A shows a possible implementation of a reverse protection circuit according to Hao-Ping Hong and Jiin-Chuan Wu with smart gate control. The reference signs in FIG. 3A correspond to the reference signs in FIG. 2 of the original document of Hao-Ping Hong and Jiin-Chuan Wu. It has a well-switch with a gate control to switch off and isolate the gate driver which are both controlled by a reverse condition comparator. However, the circuit does only work at voltage levels below 5V. In order to operate this circuit at VDD>5V the state GND should represent a low-voltage floating ground referred to the upper rail VDD. It is important to understand that a bulk switch itself prevents from destruction (e.g. due to latch-up, etc.) but does not solve the reverse current blocking, since it does not control the gate of the transistor.

FIG. 3B shows a circuit configuration which is similar to the circuit implementation of FIG. 3A. The shown circuit configuration is described in U.S. Pat. No. 6,628,489 B1. The reference signs in FIG. 3B correspond to the reference signs in FIG. 4 of U.S. Pat. No. 6,628,489 B1. The circuit realizes a reverse current protection with smart gate control. It has a well-switch with a gate control to switch off and isolate the gate driver. The well-switch and the gate control are both controlled by a reverse condition comparator. In order to operate this circuit at VDD>5V the state GND should represent a low-voltage floating ground referred to the upper rail VDD.

Figure 3C:
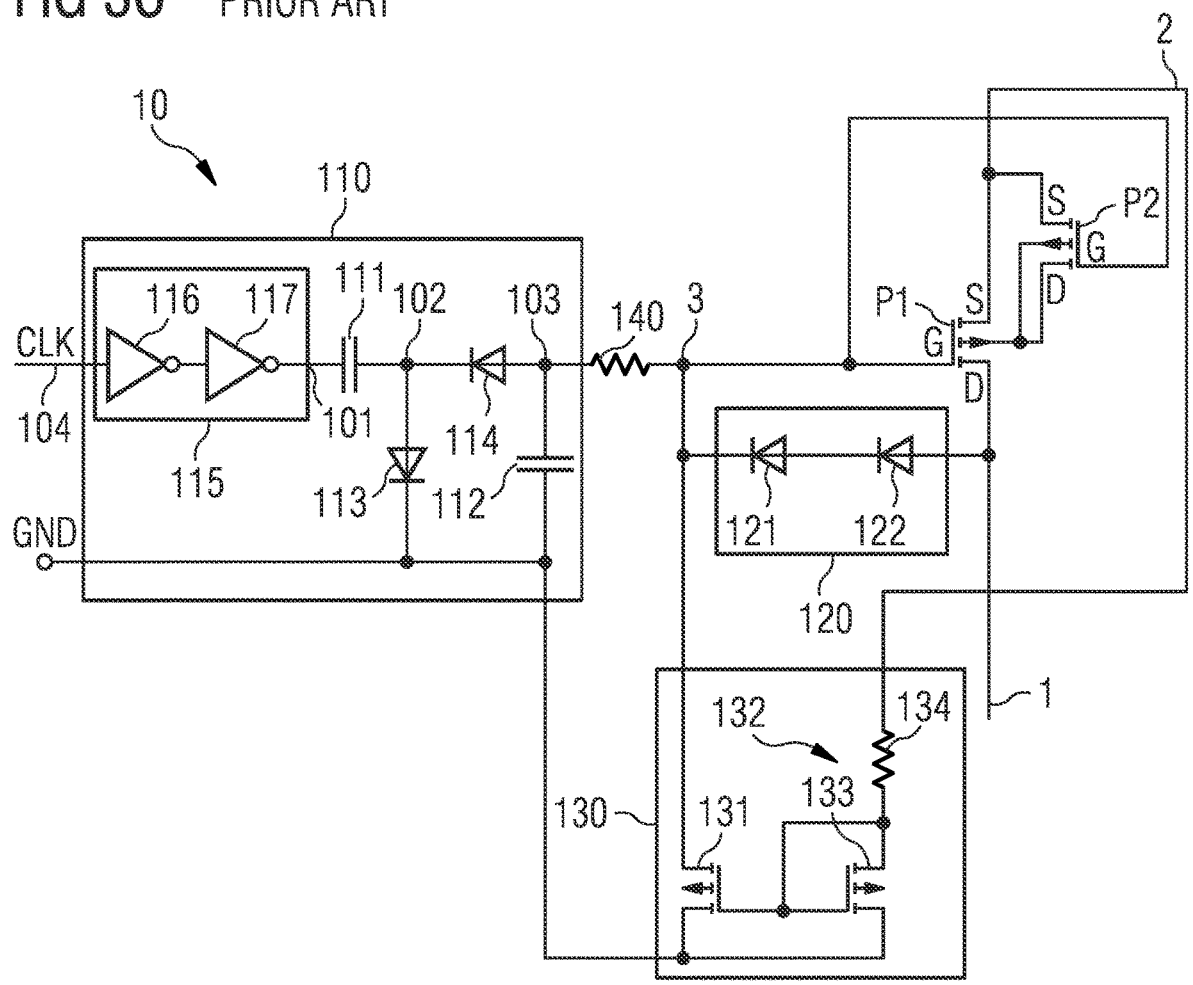
FIG. 3C shows a possible implementation of an output driver for a sensor device having reverse current protection by using a smart diode according to a prior art solution.

FIG. 3C illustrates an implementation of a circuit according to U.S. Pat. No. 8,669,805 B2. The reference signs in FIG. 3C correspond to the reference signs in FIG. 3 of U.S. Pat. No. 8,669,805 B2. This circuit allows a reverse current protection by means of a smart diode (composed of PMOS transistor) which is normally connected in series with a low side (NMOS) transistor. For the purpose of the problem to be solved, the circuit shown in FIG. 3C could also be used as a high-side driver without an additional series transistor. It is important to understand that for the circuit described in U.S. Pat. No. 8,669,805 B2, the main intention is to block the reverse current when the upper terminal is going below the substrate potential. As this is not a requirement for the problem to be solved, this results in a bad reverse current suppression.

Figure 4:
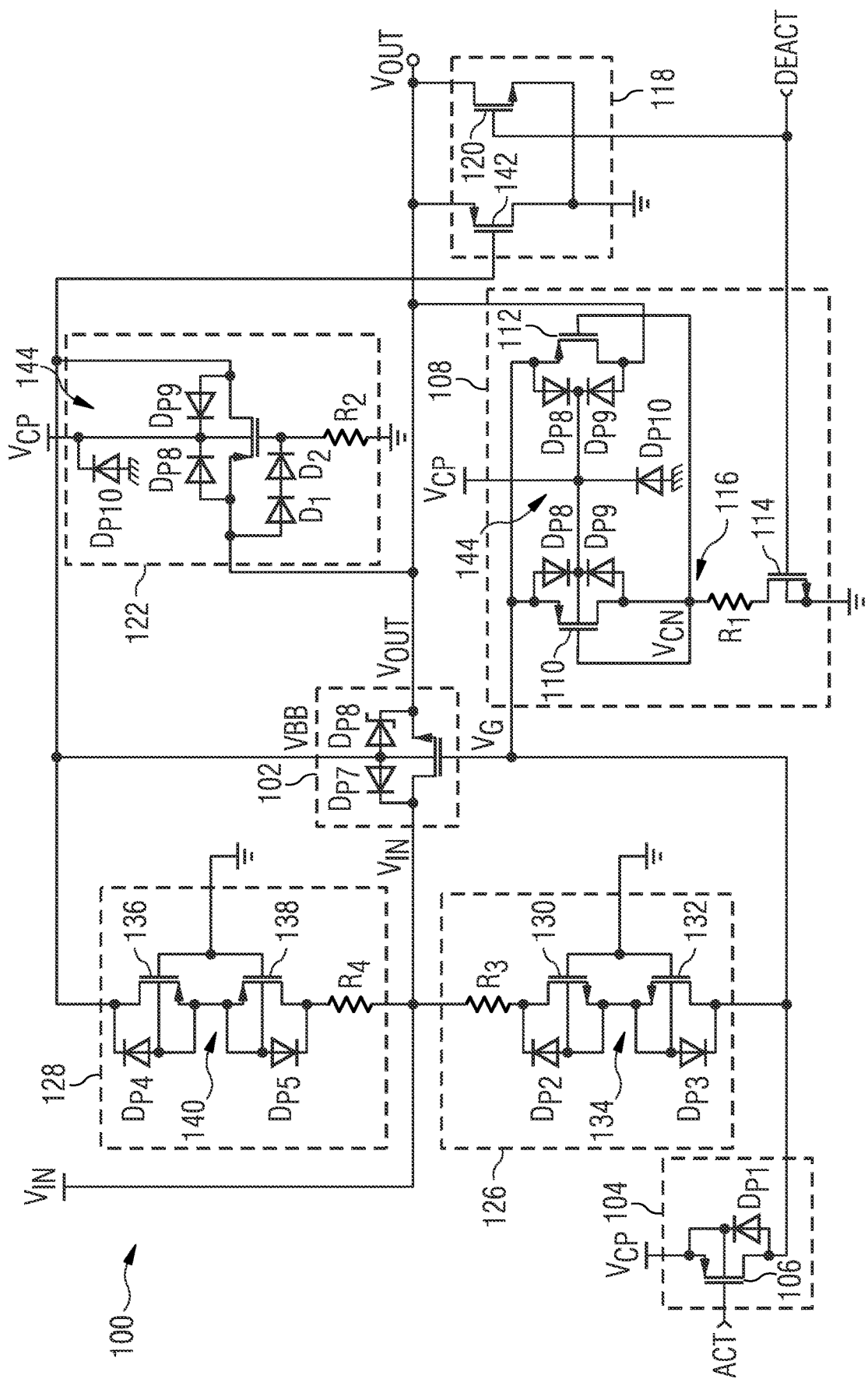
FIG. 4 shows a possible implementation of an output driver for a sensor device having reverse current protection by using a charge pump circuit according to a prior art solution.

Some systems provide an auxiliary supply rail, which is charged up by a charge-pump to a voltage above the positive supply voltage. This allows to connect either the bulk or the gate of the PMOS switch to this potential in order to cut the reverse current. This solution is needed for systems/switches which have to keep a low distortion also beyond the rails. Only to prevent a reverse current to flow this solution is an overkill. It is obvious that also a charge pump circuitry (especially if it has a dedicated oscillator) needs a remarkable area. FIG. 4 shows an embodiment of a circuit based on the above-mentioned concept that is described in detail in US 2014/0160600 A1. The reference signs in FIG. 4 correspond to the reference signs in FIG. 3 of US 2014/0160600 A1.

Figure 5:
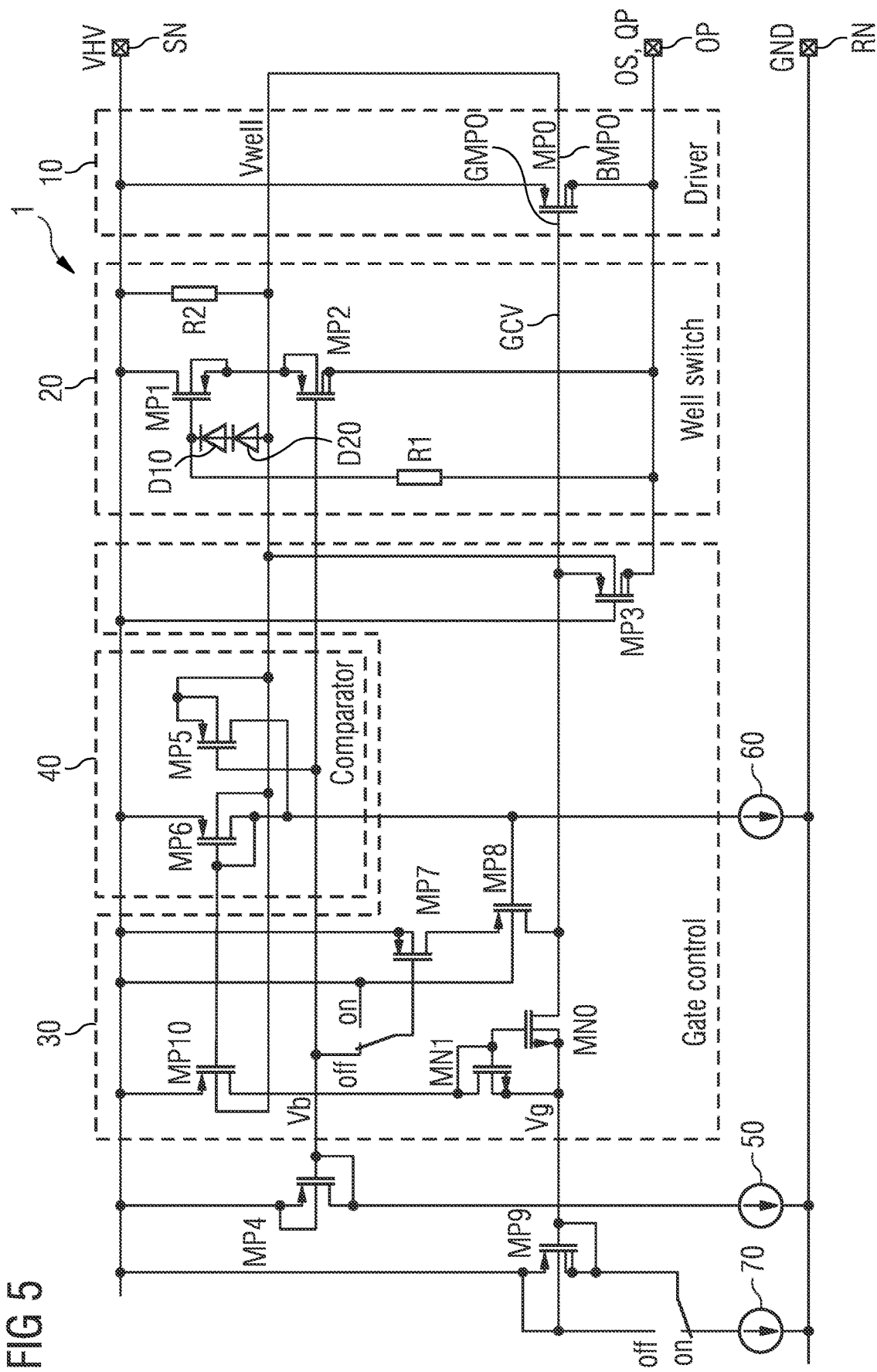
FIG. 5 shows a preferred embodiment of a high-voltage output driver for a sensor device having reverse current protection when operated in a reverse polarity condition.

FIG. 5 shows a preferred embodiment of a high-voltage output driver 1 for a sensor device that allows a controllable amount of current flowing into the output terminal of the sensor device/the output node of the output driver of the sensor device in a reverse polarity condition.

The high-voltage output driver 1 comprises a supply node SN to apply a supply voltage VHV, an output node OP to provide an output signal QP of the high-voltage output driver 1 and a reference node RN to apply a reference voltage VSS, for example a ground potential. The output driver 1 comprises an output driver stage 10 comprising a (high-side) driver transistor MP0 being disposed between the supply node SN and the output node QP. The output driver further comprises a bulk/well control circuit 20 to apply a bulk control voltage Vwell to the bulk node BMP0 of the driver transistor MP0, and a gate control circuit 30 to apply a gate control voltage GCV to the gate node GMP0 of the driver transistor MP0.

The high-voltage output driver 1 is operated in a first operation mode in which the potential QP at the output node OP is lower than the supply voltage VHV, and in a second operation mode in which the potential QP at the output node OP is higher than the supply voltage VHV. The bulk control circuit 20 is configured to apply the level of a bulk control voltage Vwell to the bulk node BMP0 of the driver transistor MP0 in dependence on operating the high-voltage output driver 1 in the first and second operation mode. The gate control circuit 30 is configured to apply the level of the gate control voltage GCV to the gate node GMP0 of the high side driver transistor MP0 in dependence on operating the high-voltage output driver 1 in the first and second operation mode.

The bulk control circuit 20 is configured to apply the supply voltage VHV to the bulk node BMP0 of the driver transistor MP0, when the high-voltage output driver 1 is operated in the first operation mode. The bulk control circuit 20 is configured to apply the potential at the output node OP to the bulk node BMP0 of the driver transistor MP0, when the high-voltage output driver 1 is operated in the second operation mode.

The gate control circuit 30 is configured to apply the supply voltage VHV to the gate node GMP0 of the driver transistor MP0, when the high-voltage output driver 1 is operated in a first state of the first operation mode, i.e. in the off-state of the first operation mode. The gate control circuit 30 is configured to apply the voltage Vg to the gate node GMP0 of the driver transistor MP0, when the high-voltage output driver 1 is operated in a second state of the first operation mode, i.e. in the on-state of the first operation mode. The gate control circuit 30 is configured to apply the potential QP at the output node OP to the gate node GMP0 of the driver transistor MP0, when the high-voltage output driver 1 is operated in the second operation mode.

The bulk control circuit 20 comprises a transistor MP1 being disposed between the supply node SN and the bulk node BMP0 of the driver transistor MP0. A control node of the transistor MP1 is coupled to the output node OP via a first resistor R1.

The control node of the transistor MP1 is further connected to the bulk node BMP0 via the in-series connected diodes D10 and D20. Diodes D10 and D20 are important for the VGS protection of the transistor MP1. The diodes D10 and D20 can be implemented, for example as LV (Low-Voltage) PMOS-transistors with their bulk nodes connected to the bulk node BMP0/bulk control voltage Vwell. A bulk node of the transistor MP1 is connected to the source node of the transistor MP1.

The bulk control circuit 20 comprises a transistor MP2 being disposed between the bulk node BMP0 of the driver transistor MP0 and the output node OP of the high-voltage output driver 1. The bulk node of the transistor MP2 is connected to the source node of the transistor MP1 or the bulk node BMP0 of the driver transistor MP0. The bulk control circuit 20 comprises a resistor R2 being disposed between the supply node SN and the bulk node BMP0 of the driver transistor MP0.

The gate control circuit 30 comprises a transistor MP3 being disposed between the gate node GMP0 of the driver transistor MP0 and the output node OP of the high-voltage output driver 1. The transistor MP3 has a gate node being coupled to the supply node SN. The bulk node of the transistor MP3 is connected to the bulk node BMP0 of the driver transistor MP0.

The high-voltage output driver 1 comprises a current source 50 being connected to the reference node RN, and a transistor MP4 being disposed between the supply node SN and the current source 50. The gate and drain node of the transistor MP4 are connected to each other. The gate node of the transistor MP4 is connected to the gate node of the transistor MP2. The bulk node of the transistor MP4 is connected to the source node of the transistor MP4 and to the supply node SN.

The high-voltage output driver 1 comprises a current source 60 being connected to the reference node RN. The high-voltage output driver 1 further comprises a detection circuit 40 to detect the first and the second operation mode of the high-voltage output driver 1. The detection circuit 40 comprises a transistor MP5 and a transistor MP6. The transistor MP5 is disposed between the bulk node BMP0 of the driver transistor MP0 and the current source 60. The bulk node of the transistor MP5 is connected to the source node of the transistor MP5. The transistor MP6 is disposed between the supply node SN and the current source 60. The drain node of the transistor MP5 is connected to the drain node of the transistor MP6. The bulk node of the transistor MP6 is connected to the drain node of the transistor MP6. The gate node of the transistor MP5 is connected to the gate node of the transistor MP4. The drain node of the transistor MP6 is connected to its gate node.

The gate control circuit 30 comprises a transistor MP7 and a transistor MP8. The source node of the transistor MP7 is connected to the supply node SN. The bulk node of the transistor MP7 is connected to supply node SN. The source node of the transistor MP8 is connected to the drain node of the transistor MP7, and the drain node of the transistor MP8 is connected to the gate node GMP0 of the driver transistor MP0. The bulk node of the transistor MP8 is connected to the supply node SN.

The gate node of the transistor MP7 is connectable to one of the gate node of the transistor MP4 and the supply node SN via a controllable switch. The gate node of the transistor MP8 is connected to the respective drain node of the transistor MP5 and the transistor MP6 and the second current source 60.

The high-voltage output driver 1 further comprises a current source 70 being connected to the reference node RN. The output driver 1 further comprises a transistor MP9 being connected between the supply node SN and the current source 70. The bulk node of the transistor MP9 is connected to the source node of the transistor MP9. Furthermore, the bulk node of the transistor MP9 is connectable to the current source 70 or the drain node of the transistor MP9 via a controllable switch. The gate control circuit 30 comprises a transistor MN0 being disposed between the gate node of the transistor MP9 and the gate node GMP0 of the driver transistor MP0. The bulk node of the transistor MN0 is connected to the gate node of the transistor MP9.

The gate control circuit 30 further comprises a transistor MP10 and a transistor MN1. The transistors MP10 and MN1 are disposed in series between the supply node SN and the gate node of the transistor MP9. The source node of the transistor MP10 is connected to the supply node SN, the drain node of the transistor MP10 is connected to the drain node of the transistor MN1, and the gate node of the transistor MP10 is connected to the gate node of the transistor MP6. The bulk node of the transistor MP10 is connected to the bulk node BMP0 of the driver transistor MP0. The drain node of the transistor MN1 is connected to the gate node of the transistor MN0, and the gate node of the transistor MN1 is connected to the gate node of the transistor MN0. The bulk node of the transistor MN1 is connected to the gate node of the transistor MP9.

The operation of the embodiment of the high-voltage output driver is described in the following.

The main high-side driving transistor of the output driver 1 is the transistor MP0 of the output driver stage 10. In the second operation state of the output driver 1, i.e. in a reverse polarity condition in which the potential QP at the output node OP is higher than the supply potential VHV at the supply node SN (QP>VHV), both the bulk node BMP0 and the gate node GMP0 of the driver transistor MP0 have to be connected to the output node OP to apply the potential QP to the bulk node BMP0 and to the gate node GMP0 of the driver transistor MP0 in order to prevent any current to flow into the output node/pin OP. Otherwise the mentioned current would flow either through the body diode of the transistor MP0 or the transistor MP0 would start conducting in reverse.

The connection of the bulk node BMP0 of the driver transistor MP0 is provided by the bulk control circuit/well-switch 20 comprising the transistors MP1, MP2 and the resistor R1. During the first operation state of the output driver 1, i.e. during the normal operation in which the potential QP at the output node OP is lower than the supply potential VHV at the supply node SN (QP<VHV), the potential Vwell applied to the bulk node BMP0 is pulled up to the supply potential VHV by means of the transistor MP1 whose gate voltage is controlled by the potential at the output node OP through the resistor R1.

When the potential QP at the output node OP is close to the supply potential VHV at the supply node SN, in particular when the potential QP is closer than a threshold voltage from the supply potential VHV, the voltage potential Vwell at the bulk node BMP0 of the driver transistor MP0 is pulled up by a resistor R2. The gate of the transistor MP2 is biased by a bias voltage Vb such to provide a negligible leakage current to the output node OP during first (normal) operation state.

As soon as the potential QP at the output node OP becomes higher than the supply potential VHV at the supply node SN (second operation state), the gate of the transistor MP1 is pulled up to the potential QP disabling the transistor MP1.

At the same time, the transistor MP2 whose gate voltage is biased at one threshold voltage below the supply potential VHV starts conducting pulling up the potential Vwell at the bulk node BMP0 to the potential QP that is applied to the output node OP. This procedure isolates the drain-to-bulk diode of the driver transistor MP0 and prevents any current to flow through it, except of the current provided by the resistance of the resistor R2.

The pulling up of the potential GCV at the gate node GMP0 of transistor MP0 is provided by the transistor MP3 which is of the same type as the main driver transistor MP0. The main driver transistor MP0 would start conducting sinking current to the supply node SN as soon as the potential QP at the node OP became higher than its threshold voltage in reverse operation. The transistor MP3 starts conducting under the same circumstances as the transistor MP0 would do, thus at the same voltage QP at node OP. This is valid since the gate voltage GCV of the transistor MP0 in the first operation state (normal operation state/off-state) is pulled up to the supply potential VHV providing the same gate-to-drain voltage as seen by the transistor MP3. In the previous mentioned condition, the transistor MP3 starts conducting pulling up the voltage potential GCV at the gate node GMP0 of transistor MP0 to the potential QP of the output node OP. This ensures that the transistor MP0 is never conducting in reverse. This ensures that there is no voltage range or gap above the supply voltage VHV where transistor MP0 is conducting in reverse.

To allow the transistor MP3 pulling up the gate voltage GCV of transistor MP0 to the potential QP at output node OP in the reverse condition, the transistors MP7 and MP8, which are connecting the gate node GMP0 of the transistor MP0 to the supply potential VHV during the normal off state condition of the first operation state, have to be switched off. This is achieved by detecting the reverse operation by means of a comparator/detection circuit 40.

The comparator/detection circuit 40 comprises the transistors MP5 and MP6. During the first operation state (normal operation state/off-state) the transistor MP6 generates a gate-source voltage which enables the transistor MP8 such to pull up the potential GCV at the gate node GMP0 of transistor MP0 to the supply potential VHV through the transistor MP7. As soon as the voltage potential QP goes above the supply potential VHV the bulk/well potential Vwell is pulled up by the bulk control circuit/well-switch 20 to the potential QP. This enables also the transistor MP5 which will pull up the potential at the gate node of transistor MP8 to the bulk potential Vwell in order to isolate it from transistor MP7.

The particularity of the proposed comparator/detection circuit 40 is that it operates in the current mode. Moreover, it does not sense the potential at the output node OP of the driver directly but it senses the bulk/well potential Vwell of the transistor MP0 which represents the potential at the output node OP of the driver 1, as soon as a reverse condition is achieved. This allows the use of isolated LV (Low-Voltage)-transistors, as the high voltage during the normal operation is not seen by the comparator 40. Regarding the circuit configuration of FIG. 5, the transistors having a double drain connection are HV (High-Voltage) transistors, whereas the other transistors are LV (Low-Voltage) transistors.

During the first/normal operation state, transistor MN0 is operated in the conductive/closed state. During the second operation state/reverse polarity state, beside transistor MP8 also transistor MN0 has to be opened, i.e. operated in the non-conductive state, to allow transistor MP3 to pull up the gate voltage GCV of transistor MP0 to the potential QP at the output node OP. This is provided by the same comparator/detection circuit 40 which pulls up the gate voltage GCV of transistor MN0 through transistors MP10 and MN1. In the second operation state/reverse condition state, as the transistor MP5 pulls up the gate of MP6 to the bulk/well potential Vwell, also the mirror comprising the transistors MP10 and MP6 will switch off. This leads the gate source voltage of transistor MN1 to become less than its threshold voltage and thus switching off transistor MN0 as well. Like this the transistor MP3 is able to pull up the potential GCV at the gate node GMP0 of transistor MP0 while all the other transistors/switches are turned off.

The isolation of the reverse current required by the some standards has to be released if there are no ESD diodes between the supply node SN and the output node OP. Otherwise the well potential Vwell would be pulled up to a voltage which exceeds the safe operating voltage of the LV-transistors in respect to the supply voltage VHV. To overcome this operation mode, the bulk connections of transistors MP7 and MP8 are tight to the supply potential VHV. This allows a reverse operation of about one diode voltage plus the reverse threshold voltage of the transistor MP0 resulting in ~1.5V. Above one diode voltage of reverse operation the body diodes of MP7 and MP8 clamp the gate node of transistor MP0 which will start conducting again pulling up VHV. This makes sure that the difference between potentials QP and VHV cannot become too high such to damage the LV-transistors.

When compared to the circuit configurations shown in FIGS. 2 to 4, the proposed circuit configuration does not require any additional external diodes, as the problem is solved in the high-voltage output driver 1 by means of a bulk control circuit/well-switch 20 in combination with a smart gate control circuit 30. Furthermore, the reverse protection is able to operate up to 3.6V-VGSp ~2.5V beyond the supply.

Compared to the circuit configuration shown in FIG. 2, the preferred embodiment of the high-voltage output driver 1 as shown in FIG. 5 does not add significant chip area, as there is no need of a transistor connected in series with the main driving transistor.

Compared to the circuit configuration shown in FIG. 3A the preferred embodiment of the high-voltage output driver 1 of FIG. 5 has the following properties.

The generation of the gate control and the reverse detection comparator take place in a voltage range within 3.6V from the upper rail. This allows the use of isolated low-voltage transistors operated at the upper rail VHV, except one transistor (MP3). This saves area as the HV-transistors occupy a big overhead in area.

The disabling of the main driver transistor MP0 is provided by means of a matched transistor MP3, which pulls up the main driver's gate GMP0 based on the same mechanism that would turn on the main driver transistor in reverse. This ensures that there is no range above the supply voltage VHV where the main driver transistor MP0 could turn on in reverse causing a current flowing into the output node/pin OP. This makes this circuit particularly suitable for the requirements provided by the standards in combination with a reverse polarity protection diode (D2), since the reverse voltage in the critical condition is equal to ~0.6V close to the supply voltage of the high-voltage output driver.

The preferred circuit configuration of FIG. 5 does not necessarily need a floating low-voltage supply referred to the upper rail, since there is no logic needed (e.g. inverters) to control the transistors. This saves significant chip area and power consumption.

The preferred embodiment of the high-voltage output driver 1 provides the flexibility to choose up to which reverse voltage the isolation of the input current ILoff has to be ensured. This is needed to self-protect the gates of the control transistors in case of an ESD event, especially during the IC manufacturing, when the external protection circuitry is not available. The circuit passively releases the isolating property of the input current.

Compared to the circuit configuration shown in FIG. 3B, the embodiment of the high-voltage output driver 1 of FIG. 5 has the following properties.

The high-voltage output driver 1 of FIG. 5 has no floating bulk nodes/wells while the circuit of FIG. 3B leaves the well floating in reverse operation.

Due to the floating wells described above the DC-currents needed for the controlling circuit will result multiplied by the beta of the parasitic vertical PNP transistor also into the substrate. This does not allow to control the remaining reverse current properly and might violate the standards, while the proposed circuit has a well-defined residual reverse current.

Compared to the circuit configuration shown in FIG. 3C, the preferred embodiment of the high-voltage output driver of FIG. 5 has the following properties.

The disabling of the main driver transistor MP0 is provided by means of a matched transistor MP3, which pulls up the main driver's gate GMP0 based on the same mechanism that would turn on the main driver transistor MP0 in reverse. This ensures that there is no range above the supply voltage VHV where the main driver transistor MP0 could turn on in reverse causing a current flowing into the output node/pin OP. The circuit shown in FIG. 3C isolates the bulk diode completely but does not disable the PMOS P1 properly. The reason is that the VDG seen by P1 in reverse is provided by the two diodes 121 and 122, which are not matched with the reverse operation of the main transistor P1. The current mirror 130 is always providing current through the diodes resulting in a voltage drop across the diodes. This can enable the main transistor P1 in some circumstances. This is a limitation of the circuit implementation of FIG. 3C as it is intended to block the reverse current when the terminal 2 goes below the substrate.

The preferred high-voltage output driver 1 of FIG. 5 has no floating wells while the circuit of FIG. 3C leaves the well floating in reverse operation.

Compared to the circuit configuration shown in FIG. 4, the preferred embodiment of the high-voltage output driver 1 of FIG. 5 does not add significant chip area, as there is no need of a charge pump circuitry. In addition the charge pump circuit needs a certain response time or/and a dedicated oscillator.

Based on the upper mentioned properties the preferred embodiment of the high-voltage output driver 1 of FIG. 5 circuit has the following advantages compared to the circuit configurations of FIGS. 2 to 4: a) less external components; b) smaller chip area, in particular less HV (High-voltage)-transistors, no floating supply, no series transistor, no charge pump circuit and no floating wells; and c) release of the isolation for self-protection.

LIST OF REFERENCE SIGNS 1 high-voltage output driver
10 output driver stage
20 bulk control circuit
30 gate control circuit
40 comparator/detection circuit
50 current source
60 current source
70 current source
100 sensor device
MP0 driver transistor
MP1, MP2 transistors of the bulk control circuit
MP3, . . . , MP10 transistors of the gate control circuit
MN0, MN1 transistors of the gate control circuit
OP output node
SN supply node
RN reference node
VHV supply potential
Vwell bulk/well potential
VSS reference potential

The invention claimed is:

1. A high-voltage output driver for a sensor device with reverse current blocking, comprising:
a supply node to apply a supply voltage,
an output node to provide an output signal of the high-voltage output driver,
a driver transistor being disposed between the supply node and the output node,
a bulk control circuit to apply a bulk control voltage to a bulk node of the driver transistor,
a gate control circuit to apply a gate control voltage to the gate node of the driver transistor,
wherein the high-voltage output driver is operated in a first operation mode in which the potential at the output node is lower than the supply voltage, and in a second operation mode in which the potential at the output node is higher than the supply voltage,
wherein the high-voltage output driver comprises a detection circuit being configured to sense the bulk control voltage to detect the first and the second operation mode of the high-voltage output driver.

2. The high-voltage output driver of claim 1,
wherein the bulk control circuit is configured to apply the level of a bulk control voltage to the bulk node of the driver transistor in dependence on operating the high-voltage output driver in the first and second operation mode,
wherein the gate control circuit is configured to apply the level of the gate control voltage to the gate node of the high side driver transistor in dependence on operating the high-voltage output driver in the first and second operation mode.

3. The high-voltage output driver of claim 1,
wherein the bulk control circuit is configured to apply the supply voltage to the bulk node of the driver transistor, when the high-voltage output driver is operated in the first operation mode,
wherein the bulk control circuit is configured to apply the potential at the output node to the bulk node of the driver transistor, when the high-voltage output driver is operated in the second operation mode.

4. The high-voltage output driver of claim 1,
wherein the gate control circuit is configured to apply the supply voltage to the gate node of the driver transistor, when the high-voltage output driver is operated in an off-state of the first operation mode,
wherein the gate control circuit 30 is configured to apply another voltage to the gate node of the driver transistor, when the high-voltage output driver
is operated in an on-state of the first operation mode,
wherein the gate control circuit is configured to apply the potential at the output node to the gate node of the driver transistor, when the high-voltage output driver is operated in the second operation mode.

5. The high-voltage output driver of claim 1,
wherein the bulk control circuit comprises a first transistor being disposed between the supply node and the bulk node of the driver transistor,
wherein a control node of the first transistor is coupled to the output node via a first resistor.

6. The high-voltage output driver of claim 1,
wherein the bulk control circuit comprises a second transistor being disposed between the bulk node of the driver transistor and the output node of the high-voltage output driver.

7. The high-voltage output driver of claim 1,
wherein the bulk control circuit comprises a second resistor being disposed between the supply node and the bulk node of the driver transistor.

8. The high-voltage output driver of claim 1,
wherein the gate control circuit comprises a third transistor being disposed between the gate node of the driver transistor and the output node of the high-voltage output driver,
wherein the third transistor has a gate node being coupled to the supply node.

9. The high-voltage output driver of claim 6, comprising:
a reference node to apply a reference voltage,
a first current source being connected to the reference node,
a fourth transistor being disposed between the supply node and the first current source,
wherein the gate and drain node of the fourth transistor are connected to each other,
wherein the gate node of the fourth transistor is connected to the gate node of the second transistor.

10. The high-voltage output driver of claim 9, comprising:
a second current source being connected to the reference node,
wherein the detection circuit comprises a fifth transistor and a sixth transistor,
wherein the fifth transistor is disposed between the bulk node of the driver transistor and the second current source,
wherein the sixth transistor is disposed between the supply node and the second current source,
wherein the drain node of the fifth transistor is connected to the drain node of the sixth transistor.

11. The high-voltage output driver of claim 10,
wherein the gate node of the fifth transistor is connected to the gate node of the fourth transistor,
wherein the drain node of the sixth transistor is connected to the gate node of the sixth transistor.

12. The high-voltage output driver of claim 10,
wherein the gate control circuit comprises a seventh transistor and an eighth transistor,
wherein the source node and the bulk node of the seventh transistor is connected to the supply node,
wherein the source node of the eighth transistor is connected to the drain node of the seventh transistor, and the drain node of the eighth transistor is connected to the gate node of the driver transistor, and the bulk node of the eighth transistor is connected to the supply node.

13. The high-voltage output driver of claim 12,
wherein the gate node of the seventh transistor is connectable to one of the gate node of the fourth transistor and the supply node,
wherein the gate node of the eighth transistor is connected to the respective drain node of the fifth transistor and the sixth transistor and the second current source.

14. The high-voltage output driver of claim 4, comprising:
a third current source being connected to a reference node to apply a reference voltage,
a ninth transistor being connected between the supply node and the third current source,
wherein the gate control circuit comprises a tenth transistor being disposed between the gate node of the ninth transistor and the gate node of the driver transistor,
wherein the gate control circuit is configured to apply the gate voltage at the gate of the ninth transistor to the gate node of the driver transistor, when the high-voltage output driver is operated in the second state of the first operation mode.

15. The high-voltage output driver of claim 14,
wherein the gate control circuit comprises an eleventh transistor and a twelfth transistor,
wherein the eleventh and twelfth transistor are disposed in series between the supply node and the gate node of the ninth transistor,
wherein the source node of the eleventh transistor is connected to the supply node, the drain node of the eleventh transistor is connected to the drain node of the twelfth transistor, and the gate node of the eleventh transistor is connected to the gate node of the sixth transistor,
wherein the drain node of the twelfth transistor is connected to the gate node of the tenth transistor, and the gate node of the twelfth transistor is connected to the gate node of the tenth transistor.

* * * * *